(12) United States Patent
Min

(10) Patent No.: US 8,951,629 B2
(45) Date of Patent: Feb. 10, 2015

(54) HEAT DISSIPATING TAPE USING CONDUCTIVE FIBER AND METHOD FOR MANUFACTURING SAME

(71) Applicant: Solueta, Ansan, Gyeonggi-Do (KR)

(72) Inventor: Eui Hong Min, Gyeonggi-Do (KR)

(73) Assignee: Solueta, Ansan, Gyeonggi-Do (KR)

( * ) Notice: Subject to any disclaimer, the term of this patent is extended or adjusted under 35 U.S.C. 154(b) by 0 days.

(21) Appl. No.: 14/064,746

(22) Filed: Oct. 28, 2013

(65) Prior Publication Data

US 2014/0050915 A1 Feb. 20, 2014

Related U.S. Application Data

(63) Continuation of application No. PCT/KR2012/003295, filed on Apr. 27, 2012.

(30) Foreign Application Priority Data

Apr. 28, 2011 (KR) .................. 10-2011-0040331
Apr. 27, 2012 (KR) .................. 10-2012-0044490

(51) Int. Cl.
*G11B 5/708* (2006.01)
*G11B 5/735* (2006.01)
*G11B 5/738* (2006.01)
(Continued)

(52) U.S. Cl.
CPC ............ *H05K 7/20481* (2013.01); *H05K 9/009* (2013.01); *C09J 7/0296* (2013.01); *C09J 7/045* (2013.01); *C08K 3/04* (2013.01); *C09J 2201/602* (2013.01); *C09J 2203/326* (2013.01); *C09J 2205/102* (2013.01); *C09J 2400/163* (2013.01); *C09J 2400/263* (2013.01);
(Continued)

(58) Field of Classification Search
CPC ........ G11B 5/708; G11B 5/735; G11B 5/738; C08J 7/047; C09J 7/0246; C09J 7/0296; C09J 2433/00; B32B 7/12; B32B 27/08
USPC ......................................... 428/323, 343, 355
See application file for complete search history.

(56) References Cited

U.S. PATENT DOCUMENTS

2004/0053049 A1* 3/2004 Tsunashima et al. ......... 428/375
2008/0206544 A1* 8/2008 Kim et al. .................. 428/305.5
(Continued)

FOREIGN PATENT DOCUMENTS

KR    1996-008606     6/1996
KR     960008606 B1   6/1996
(Continued)

*Primary Examiner* — Samir Shah
(74) *Attorney, Agent, or Firm* — Mintz Levin Cohn Ferris Glovsky and Popeo, P.C.

(57) ABSTRACT

The present invention relates to a heat dissipating tape using a conductive fiber and a method for manufacturing same. More particularly, the present invention provides a heat dissipating tape, comprising: a conductive substrate which is made of conductive fiber coated with a conductive material; and an heat dissipating adhesion layer which is formed on at least one side of the conductive substrate and is coated with a heat dissipating adhesive including a graphite-containing acrylic adhesive or silicon adhesive. The heat dissipating tape has excellent resistance to external forces on the product, has an excellent outer appearance due to its smooth surface, is less likely to get damaged, and the heat dissipating adhesion layer is not easily separated from the conductive substrate.

1 Claim, 3 Drawing Sheets

(51) Int. Cl.
  *B32B 7/12* (2006.01)
  *B32B 27/08* (2006.01)
  *H05K 7/20* (2006.01)
  *H05K 9/00* (2006.01)
  *C09J 7/02* (2006.01)
  *C09J 7/04* (2006.01)
  *C08K 3/04* (2006.01)
(52) U.S. Cl.
  CPC ......... *C09J 2433/00* (2013.01); *C09J 2467/00* (2013.01); *C09J 2483/00* (2013.01)
  USPC .......................... 428/323; 428/343; 428/355

(56) References Cited

U.S. PATENT DOCUMENTS

2010/0012884 A1* 1/2010 Nakamichi et al. ............. 252/70
2010/0147578 A1* 6/2010 Matsumura et al. .......... 174/388

FOREIGN PATENT DOCUMENTS

| KR | 10-2009-0028281 A | 3/2009 |
| KR | 10-2009-0043633 A | 5/2009 |
| KR | 10-2009-0114163 A | 11/2009 |

* cited by examiner

HEAT DISSIPATING TAPE USING CONDUCTIVE FIBER AND METHOD FOR MANUFACTURING SAME

CROSS-REFERENCE TO RELATED APPLICATIONS

The present application is a continuation of International Application No. PCT/KR2012/003295 filed on Apr. 27, 2012, which claims priority to Korean Application No. 10-2011-0040331 filed on April 28, 2011 and Korean Application No. 10-2012-0044490 filed on Apr. 27, 2012, which applications are incorporated herein by reference.

TECHNICAL FIELD

The present invention relates to a heat dissipating tape using a conductive fiber and a method of manufacturing the same. More particularly, the present invention relates to a heat dissipating tape having high heat transfer efficiency and an electromagnetic wave blocking effect and a method of manufacturing the same.

BACKGROUND ART

Generally, when an electronic appliance operates, heat is generated from electronic components included in the electronic appliance. At this time, when the generated heat is not rapidly discharged to the outside of the electronic appliance, the electronic components are influenced by the heat, with the result that these electronic components may not perform their intended functions. Specifically, due to the heat generated from the electronic components, parts or appliances adjacent to the electronic components may cause noise and malfunction, thus reducing the life time of the electronic appliance.

Recently, as electronic appliances have become high-performance, high-function, light-weight, thin, short and small, electronic components have been required to have a large capacity and high integration. Under such circumstances, the performance and quality of an electronic appliance depends on how to effectively dissipate heat generated from parts of the electronic appliance.

Thus, various heat dissipating methods have been attempted in order to remove the heat generated from such electronic components. As such heat dissipating methods, fin-fan cooling, thermoelectric cooling (Peltier cooling), water-jet cooling, immersion cooling, heat pipe cooling and the like have been used. Meanwhile, recently, in accordance with the trend of electronic appliances becoming slimmer and smaller, devices for effectively cooling electronic components and devices for effectively dissipating heat generated from electronic components have been required.

For this purpose, in ultra-light and ultra-slim appliances such as notebooks, mobile phones and the like, methods of removing heat from electronic components by attaching a heat dissipating tape thereto have recently been attempted.

However, a conventional heat dissipating tape is problematic in that its conductive substrate is fabricated in the form of acryl foam, so there are limitations in making the conductive substrate slimmer and improving its heat dissipating capacity. Further, the conventional heat dissipating tape is problematic in that, when external force is applied to a product in the procedure of fabricating the heat dissipating tape, the product is extended or contracted, so the heat dissipating tape is damaged even at the time of refabricating this heat dissipating tape, and thus it is impossible to reuse the heat dissipating tape. Moreover, the conventional heat dissipating tape is problematic in that alumina or the like is used as heat dissipating powder, so the surface of the heat dissipating tape becomes rough, with the result that the external appearance thereof becomes poor, a conductive fiber is easily stripped, and the product thereof is frequently damaged.

SUMMARY

Accordingly, the present invention has been devised to solve the above-mentioned problems, and an object of the present invention is to provide a heat dissipating tape, which can be made thinner because a conductive substrate is composed of a conductive fiber, which is not extended or contracted even when external force is applied in its manufacturing process, which has high heat transfer efficiency and an electromagnetic wave blocking effect even after its reproducing process, and which has a good external appearance and is not easily damaged because its own surface is smooth, and to provide a method of manufacturing the same.

In order to accomplish the above object, an aspect of the present invention provides a heat dissipating tape for blocking electromagnetic waves generated from parts of an electronic device and removing heat emitted therefrom, including: a conductive substrate; and a heat dissipating adhesion layer, wherein the conductive substrate is made of a conductive fiber, and the heat dissipating adhesion layer is formed on at least one side of the conductive substrate and is coated with a heat dissipating adhesive including a graphite-containing acrylic adhesive or silicon adhesive. Here, the conductive fiber of the conductive substrate may be a polyester fiber. Further, the graphite may have a diameter of 5~15 µm. Further, the graphite may be included in an amount of 10 to 15 parts by weight based on 100 parts by weight of the acryl adhesive or silicon adhesive. Further, the conductive fiber may be sequentially coated on at least one side thereof with nickel, copper and nickel.

Another aspect of the present invention provides a method of manufacturing a heat dissipating tape, including the steps of: washing a conductive fiber to be used as a conductive substrate with water; and applying a heat dissipating adhesive including a graphite-containing acrylic adhesive or silicon adhesive to at least one side of the conductive fiber to form a heat dissipating adhesion layer. Here, the conductive fiber of the conductive substrate may be a polyester fiber. Further, the graphite may have a diameter of 5~15 µm. Further, the graphite may be included in an amount of 10 to 15 parts by weight based on 100 parts by weight of the acryl adhesive or silicon adhesive. Further, the method may further include the step of sequentially coating at least one side of the conductive fiber with nickel, copper and nickel, after the step of washing the conductive fiber with water.

The heat dissipating tape according to the present invention can be made thinner because its conductive substrate is composed of a conductive fiber.

Further, the heat dissipating tape according to the present invention is not extended or contracted even when external force is applied to its conductive substrate composed of a conductive fiber.

Further, the heat dissipating tape according to the present invention can exhibit a high electromagnetic wave blocking effect and high heat dissipating performance.

Moreover, the heat dissipating tape according to the present invention is advantageous in that it has excellent adhesivity, it has good appearance because its surface is smooth, it is not easily damaged, and its conductive fiber is not easily stripped from a heat dissipating adhesion layer.

BRIEF DESCRIPTION OF DRAWINGS

FIG. is a sectional view showing a heat dissipating tape using a conductive fiber according to Example 1.

DETAILED DESCRIPTION

Figure 1:
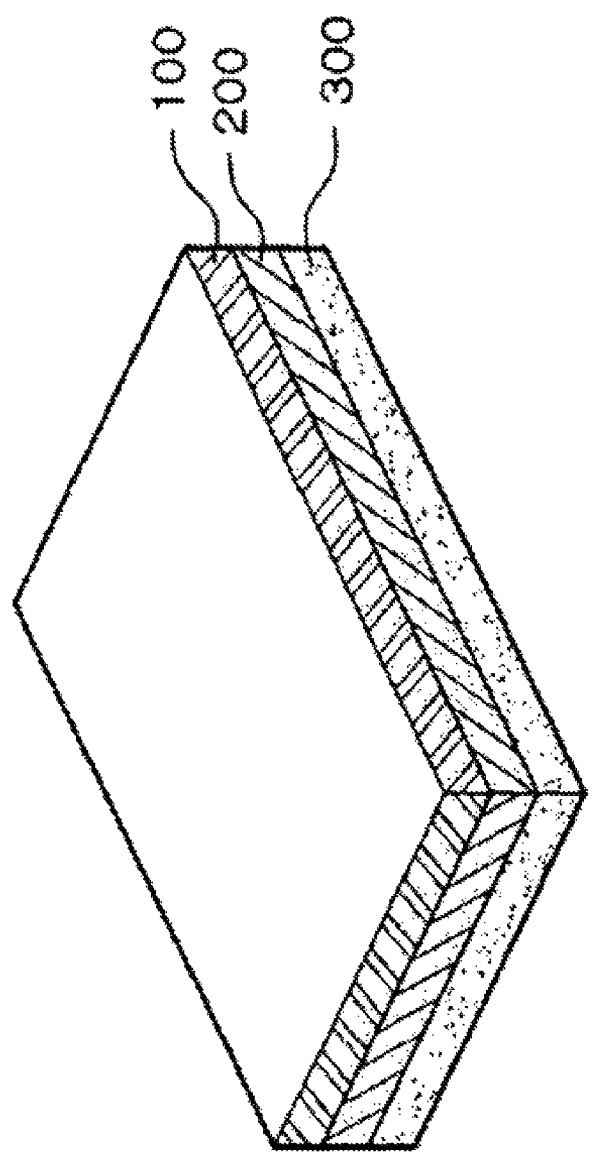

Thus, the present inventors have made efforts to overcome the above-mentioned problems. As a result, they found that, when a heat dissipating tape is manufactured using a conductive substrate made of a conductive fiber, the product becomes thinner, and the product is not extended or contracted by a worker. Further, they found that, when graphite is used as heat dissipating powder in manufacturing a heat dissipating tape, the surface of the tape is smooth, so the appearance of the tape is good, damage to the tape is prevented, and it is possible to prevent the heat dissipating adhesion layer from being separated from conductive fiber. Based on these findings, the present invention has been completed.

The heat dissipating tape according to the present invention includes a conductive substrate and a heat dissipating adhesion layer, and serves to block electromagnetic waves generated from parts of an electronic device and remove heat emitted therefrom. Here, the conductive substrate may be made of a conductive fiber, and the heat dissipating adhesion layer may be formed on at least one side of the conductive substrate and may be coated with a heat dissipating adhesive including a graphite-containing acrylic adhesive or silicon adhesive. The conductive fiber of the conductive substrate is not particularly limited, but, preferably, may be a polyester fiber. Further, as the conductive fiber, a woven fabric having a thickness of 30~40 µm or a nonwoven fabric having a thickness of 100 µm may be used. Further, in order to impart conductivity to the conductive fiber, the conductive fiber may be coated with a conductive material. The conductive material is not particularly limited as long as it imparts conductivity to the conductive fiber, but, preferably, may be nickel or copper. The order of applying the conductive material is not particularly limited, but, preferably, the conductive fiber may be sequentially coated on at least one side thereof with nickel, copper and nickel. Further, the conductive material may be applied to at least one side of the conductive fiber to a thickness of 20~50 µm.

The heat dissipating adhesion layer may be formed by applying a heat dissipating adhesive to at least one side of the conductive fiber constituting the conductive substrate. The heat dissipating adhesive may include an acrylic adhesive or silicon adhesive which can attach heat dissipating powder to the conductive substrate. Further, the heat dissipating adhesive may further include heat dissipating powder in order to improve a heat dissipating effect. The heat dissipating adhesive may include graphite as the heat dissipating powder. As such, when the heat dissipating adhesive includes graphite as the heat dissipating powder, compared to when a different kind of heat dissipating powder such as alumina or the like is used, the surface of the heat dissipating tape becomes smooth, so the appearance thereof becomes good, thereby preventing the heat dissipating tape from being damaged. Further, in this case, it is possible to prevent the heat dissipating adhesion layer from being separated from the conductive substrate, thus further improving the adhesivity of the heat dissipating tape. Moreover, in this case, the adhesivity of the heat dissipating tape can be maintained even when external force is applied. Further, the size of the graphite is not particularly limited, but, preferably, the diameter of the graphite may be 5~15 µm. When the diameter of the graphite is less than 5 µm, the heat dissipating effect of the heat dissipating tape may be lowered, and, when the diameter thereof is more than 15 µm, the surface of the heat dissipating tape may become rough (refer to Example 1 below). Further, the graphite may be used in an amount of 10 to 15 parts by weight based on 100 parts by weight of the acryl adhesive or silicon adhesive. When the graphite is added in an amount of less than 10 parts by weight, the thermal conductivity of the heat dissipating tape is lowered, and, when the graphite is added in an amount of more than 15 parts by weight, the adhesivity of the heat dissipating tape is lowered (refer to Test Example 4 below).

The method of manufacturing a heat dissipating tape according to the present invention includes the steps of: washing a conductive fiber to be used as a conductive substrate with water; and applying a heat dissipating adhesive including a graphite-containing acrylic adhesive or silicon adhesive to at least one side of the conductive fiber to form a heat dissipating adhesion layer. The conductive fiber of the conductive substrate is not particularly limited, but, preferably, may be a polyester fiber. Further, as the conductive fiber, a woven fabric having a thickness of 30~40 µm or a nonwoven fabric having a thickness of 100 µm may be used. Further, in order to impart conductivity to the conductive fiber, the conductive fiber may be coated with a conductive material. The method may further include the step of coating the conductive fiber with the conductive material after the step of washing the conductive fiber with water. The conductive material is not particularly limited as long as it imparts conductivity to the conductive fiber, but, preferably, may be nickel or copper. The order of applying the conductive material is not particularly limited, but, preferably, the conductive fiber may be sequentially coated on at least one side thereof with nickel, copper and nickel. Further, the conductive material may be applied to at least one side of the conductive fiber to a thickness of 20~50 µm.

The heat dissipating adhesion layer may be formed on at least one side of the conductive fiber. In the method, the heat dissipating adhesion layer may be formed by applying a heat dissipating adhesive to at least one side of the conductive fiber. The heat dissipating adhesive may include an acrylic adhesive or silicon adhesive which can attach heat dissipating powder to the conductive substrate. Further, the heat dissipating adhesive may further include heat dissipating powder in order to improve a heat dissipating effect. The heat dissipating adhesive may include graphite as the heat dissipating powder. As such, when the heat dissipating adhesive includes graphite as the heat dissipating powder, compared to when a different kind of heat dissipating powder such as alumina or the like is used, the surface of the heat dissipating tape becomes smooth, so the appearance thereof becomes good, thereby preventing the heat dissipating tape from being damaged. Further, in this case, it is possible to prevent the heat dissipating adhesion layer from being separated from the conductive substrate, thus further improving the adhesivity of the heat dissipating tape. Moreover, in this case, the adhesivity of the heat dissipating tape can be maintained even when external force is applied. Further, the size of the graphite is not particularly limited, but, preferably, the diameter of the graphite may be 5~15 µm. When the diameter of the graphite is less than 5 μm, the heat dissipating effect of the heat dissipating tape may be lowered, and, when the diameter thereof is more than 15 μm, the surface of the heat dissipating tape may become rough (refer to Example 1 below).

Further, the graphite may be used in an amount of 10 to 15 parts by weight based on 100 parts by weight of the acryl adhesive or silicon adhesive. When the graphite is added in an amount of less than 10 parts by weight, the thermal conductivity of the heat dissipating tape is lowered, and, when the graphite is added in an amount of more than 15 parts by weight, the adhesivity of the heat dissipating tape is lowered (refer to Test Example 4 below).

The present invention will be described in more detail with reference to the following Examples. However, these Examples are set forth to illustrate the present invention, and the scope of the present invention is not limited thereto.

EXAMPLES

Example 1

20 g of a polyester cloth including a woven fabric (Taffeta) having a thickness of 30~40 μm and a nonwoven fabric having a thickness of 100 μm was used. This polyester cloth was sufficiently washed to provide a fiber substrate.

Further, in a catalytic process, an aqueous solution including palladium 0.07 g/L, tin 4.5 g/L and 36% hydrochloric acid 220 ml/L as was provided, and the provided polyester cloth was dipped in the aqueous solution at a temperature of 30° C. for 2 minutes, and was then washed with water.

Further, in an etching process, the polyester cloth was dipped in 15% sulfuric acid at a temperature of 60° C. for 1 minute, and was then washed with water.

Further, a first electroless nickel plating solution including nickel sulfate 22.7 g/L, sodium hypophosphate 17 g/L and sodium citrate 34 g/L was provided.

Further, a second electroless nickel plating solution including nickel sulfate 27 g/L, sodium hypophosphate 20 g/L and sodium citrate 40 g/L was provided.

Then, the polyester cloth was dipped in the first electroless nickel plating solution at 38° C. for 1 minute, dipped in the second electroless nickel plating solution at 38° C. for 2 minutes, and then washed with water.

Subsequently, the polyester cloth was dipped in an electroless copper plating solution including copper 3.5 g/L, 37% formalin 4 g/L and sodium hydroxide 8 g/L at 30° C. for 10 minutes, and then washed with water. Subsequently, a third electroless nickel plating solution including nickel sulfate 22.7 g/L, sodium hypophosphite 17 g/L and sodium citrate 34 g/L was provided. Further, a fourth electroless nickel plating solution including nickel sulfate 20.5 g/L, sodium hypophosphate 15 g/L and sodium citrate 30 g/L was provided. Then, the polyester cloth dipped in the electroless copper plating solution and then washed with water was dipped in the third electroless nickel plating solution at 36° C. for 1 minute, dipped in the fourth electroless nickel plating solution at 36° C. for 3 minutes, and then washed with water to obtain a conductive substrate including a uniformly-plated conductive fiber.

Meanwhile, a heat dissipating adhesive for forming the heat dissipating adhesion layer provided on the conductive substrate was prepared by the steps of: mixing 11. 1 parts by weight of graphite having a particle size of 5~15 μm and a density of 2 g/cm$^3$ to form a mixture; stirring the mixture for 30~60 minutes using a high-speed stirrer to uniformly disperse graphite particles in the mixture; stabilizing the mixture at a temperature of 20~30° C. for 30~60 minutes to defoam the mixture. Thereafter, the heat dissipating adhesive was applied to one side of the conductive substrate using a comma coater. Further, a releasable film (paper) was applied to the other side of the conductive substrate coated on one side thereof with the heat dissipating adhesive.

In this case, the application of the heat dissipating adhesive was conducted such that the thickness thereof is larger than desire thickness by 40% or more, because the thickness thereof is reduced due to the volatilization of a solvent. Thereafter, the conductive substrate provided with the heat dissipating adhesion layer was left and aged at a temperature of 40~60° C. for 24 hours in a stabilizing chamber to stabilize polymers included in the heat dissipating adhesion layer.

Then, the releasable film (paper) was detached from the conductive substrate in order to allow the conductive substrate to be attached to a heat-related adherend.

Thus, the heat dissipating tape of the present invention using a conductive fiber was manufactured.

The thickness of the final product was 200 μm, which includes the thickness (50 μm) of the heat dissipating adhesive applied to one side of the conductive substrate, the thickness (50 μm) of the heat dissipating adhesive applied to the other side of the conductive substrate and the thickness of the conductive substrate was 100 μm. FIG. 1 is a sectional view showing the heat dissipating tape using a conductive fiber according to Example 1. In FIG. 1, the reference numeral "100" indicates a heat dissipating adhesion layer, "200" indicated a conductive substrate, and "300" indicates a heat dissipating adhesion layer.

Example 2

A heat dissipation tape was manufactured in the same manner as in Example 1, except that the amount of the graphite was 8.8 parts by weight.

Example 3

A heat dissipation tape was manufactured in the same manner as in Example 1, except that the amount of the graphite was 16.6 parts by weight.

COMPARATIVE EXAMPLES

Comparative Example 1

A conventional heat dissipating tape, in which a conductive substrate was fabricated in the form of acrylic foam.

Comparative Example 2

A heat dissipating tape was manufactured, except that nickel was used as heat dissipating powder instead of graphite.

TEST EXAMPLES

Test Example 1

Measurement of Thermal Conductivity

The measurement of thermal conductivity of the heat dissipating tape of Example 1 was committed to Ajou R&D Center in Ajou University. The measurement thereof was conducted by a flash method. LFA, manufactured by Netzsch Corporation, was used as an apparatus for measuring the same. The results thereof are summarized in Table 1 below.

TABLE 1

Measurement date: Oct. 8, 2010
Measurement place: Ajou R&D Center
Measurement apparatus: LFA (Netzsch Corp.)
Sample: Example

| Measurement results | Thermal conductivity [W/mK] |
|---|---|
| First | 0.773 |
| Second | 0.775 |
| Third | 0.772 |
| Fourth | 0.774 |
| Fifth | 0.774 |
| Average | 0.774 |

Table 1 above shows the thermal conductivity of the heat dissipating tape of Example 1, wherein the average thermal conductivity is 0.774 W/mK.

Test Example 2

Measurement of Electromagnetic Wave Blocking Capability

The measurement of electromagnetic wave blocking capability of the heat dissipating tape of Example 1 was committed to Korea Electromagnetic Research Center. The measurement thereof was conducted according to Electromagnetic blocking standard [KS C 0304]. Network Spectrum Impedance Analyzer (Model name: 4396B, manufactured by Agilent Corporation, measurement range: 0.1 kHz~1.8 GHz) and Shielding Effectiveness test Fixture (Model name: EM-2107A, manufactured by Electo-Metrics Co. Ltd, measurement range: 30~1500 MHz) were used as apparatuses for measuring the same.

Figure 2:
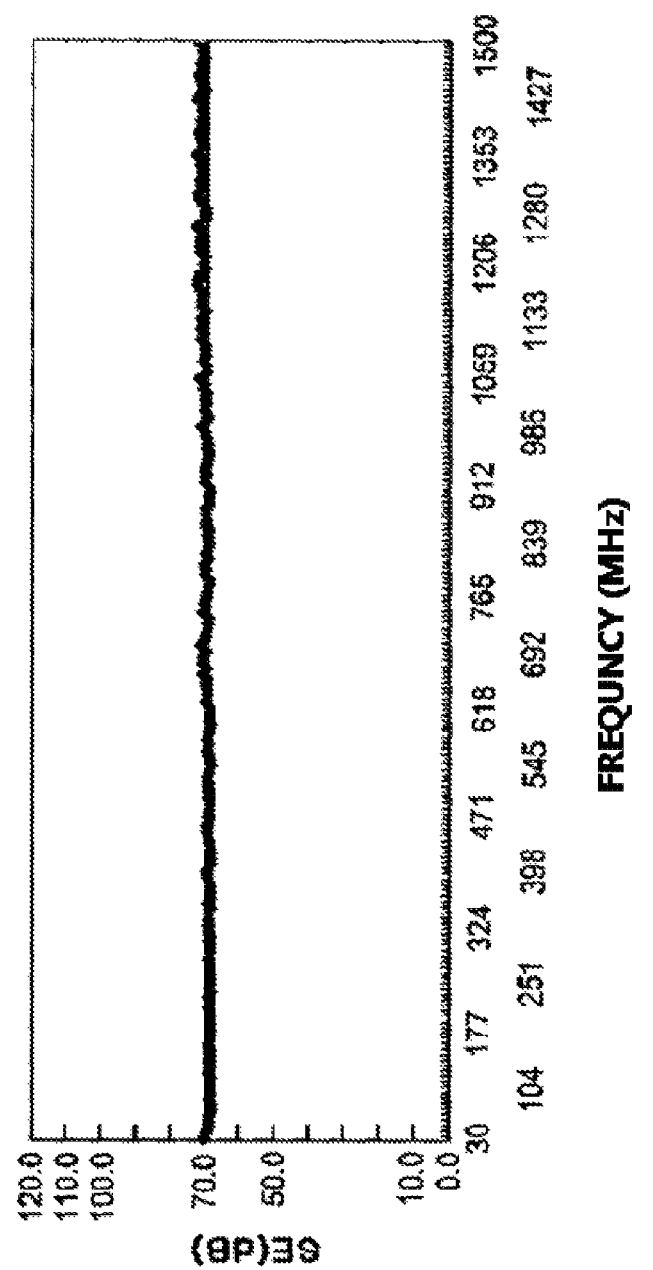
FIG. 2 is a graph showing the test results of measurement of electromagnetic wave blocking effects of a heat dissipating tape using a conductive fiber according to Example 1.

FIG. 2 is a graph showing the test results of measurement of electromagnetic wave blocking capability of the heat dissipating tape of Example 1, wherein the electromagnetic wave blocking capability thereof is approximately 70 dB.

Test Example 3

Measurement of Tensile Strength

Figure 3:
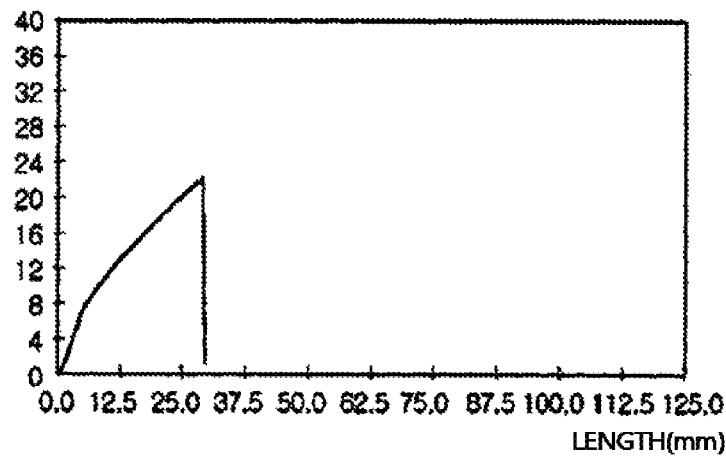
FIGS. 3(a) and 3(b) show graphs showing the test results of measurement of tensile strengths of heat dissipating tapes of Example 1 and Comparative Example 1.
Figure 3:
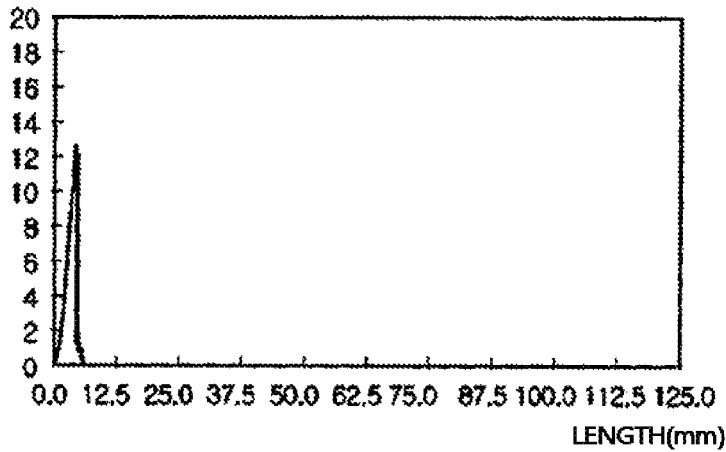

Tests for measuring tensile strengths of heat dissipating tapes of Example 1 and Comparative Example 1 were carried out. FIG. 3 shows graphs showing the test results thereof.

As shown in FIG. 3(a), it was observed that the heat dissipating tape of Example 1 was torn by a force of 2.0 kgf. In contrast, as shown in FIG. 3(b), it was observed that the heat dissipating tape of Comparative Example 1 was torn by a force of 1.2 kgf. Consequently, it can be ascertained that the resistance of the heat dissipating tape of Example 1 to external force is higher than that of the heat dissipating tape of Comparative Example 1 to external force. From the test results, it can be evaluated that, even when external force is applied, the extension or contraction of the heat dissipating tape of Example 1 is reduced compared to that of the heat dissipating tape of Comparative Example 1.

Test Example 4

Measurement of Changes in Thermal Conductivity and Adhesivity According to Content of Graphite Tests for measuring the changes in thermal conductivity and adhesivity of heat dissipating tapes of Examples 1, 2 and 3 were carried out. The tests were carried out in the same manner as in Test Example 1. The results thereof are summarized in Table 2 below.

TABLE 2

| Class. | Thermal conductivity (W/mK) | Adhesivity (gf/25 mm) |
|---|---|---|
| Example 1 | 0.774 | 1100~1200 |
| Example 2 | 0.62 | 1000~1100 |
| Example 3 | 0.896 | 700~800 |

As given in Table 2 above, it can be ascertained that the thermal conductivity of the heat dissipating tape of Example 2 is lower than that of the heat dissipating tape of Example 1, and that the adhesivity of the heat dissipating tape of Example 3 is lower than that of the heat dissipating tape of Example 1. Consequently, it can be evaluated that the heat dissipating tape of Example 1 is excellent in both thermal conductivity and adhesivity.

Test Example 5

Measurement of Thermal Conductivity of Heat Dissipating Tape According to the kind of Heat Dissipating Powder Tests for measuring the changes in thermal conductivity of heat dissipating tapes of Example 1 and Comparative Example according to the kind of heat dissipating powder were carried out. The tests were carried out in the same manner as in Test Example 1. The results thereof are summarized in Table 3 below.

TABLE 3

| Class. | Thermal conductivity (W/mK) |
|---|---|
| Example 1 | 0.774 |
| Comparative Example 2 | 0.491 |

As given in Table 3 above, it can be evaluated that the thermal conductivity of the heat dissipating tape of Example 1 using graphite as heat dissipating powder is higher than that of the heat dissipating tape of Comparative Example 2 using metal powder as heat dissipating powder.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A heat dissipating tape for blocking electromagnetic waves generated from parts of an electronic device and removing heat emitted therefrom, whose thermal conductivity is 0.772-0.775 W/Mk and adhesivity is 1100-1200 gf/25mm, comprising: a conductive substrate; and a heat dissipating adhesion layer, wherein the conductive substrate is made of polyester fiber, wherein the polyester fiber is sequentially coated on at least one side thereof with nickel, copper and nickel, and wherein the conductive substrate comprises a non-woven fabric, and the heat dissipating adhesion layer is formed on both sides of the conductive substrate wherein the heat dissipating adhesion layer includes a graphite-containing acrylic adhesive, wherein the thickness ratio of the conductive substrate to the heat dissipation layer on each side is 100 μm:50 μm, and wherein the graphite is included in an amount of 11.1 to 15 part by weight based on 100 parts by weight of the acrylic adhesive, and wherein the graphite has a diameter of 5-15 μm.

* * * * *